United States Patent
Mathew et al.

(10) Patent No.: US 9,037,881 B2
(45) Date of Patent: May 19, 2015

(54) SYSTEM AND METHOD FOR POWER FLOW MAPPING IN A DATACENTER

(71) Applicants: Abey K. Mathew, Georgetown, TX (US); John J. Breen, III, Harker Heights, TX (US); Mark A. Muccini, Georgetown, TX (US)

(72) Inventors: Abey K. Mathew, Georgetown, TX (US); John J. Breen, III, Harker Heights, TX (US); Mark A. Muccini, Georgetown, TX (US)

(73) Assignee: Dell Products, LP, Round Rock, TX (US)

( * ) Notice: Subject to any disclaimer, the term of this patent is extended or adjusted under 35 U.S.C. 154(b) by 229 days.

(21) Appl. No.: 13/650,644

(22) Filed: Oct. 12, 2012

(65) Prior Publication Data

US 2014/0108827 A1    Apr. 17, 2014

(51) Int. Cl.
*G06F 1/00* (2006.01)
*H05K 7/14* (2006.01)

(52) U.S. Cl.
CPC .................................. *H05K 7/1498* (2013.01)

(58) Field of Classification Search
CPC ................................................... H02H 1/0076
USPC .............................................. 713/2; 375/259
See application file for complete search history.

(56) References Cited

U.S. PATENT DOCUMENTS

| | | | |
|---|---|---|---|
| 7,720,987 B2 | 5/2010 | Penk et al. | |
| 8,037,330 B2 | 10/2011 | Livescu et al. | |
| 8,732,508 B2 * | 5/2014 | Cochran et al. | 713/340 |
| 2002/0141210 A1 * | 10/2002 | Glannopoulos et al. | 363/97 |
| 2004/0010649 A1 * | 1/2004 | Weaver et al. | 710/302 |
| 2009/0189774 A1 * | 7/2009 | Brundridge et al. | 340/654 |
| 2009/0217073 A1 * | 8/2009 | Brech et al. | 713/340 |
| 2009/0307515 A1 | 12/2009 | Bandholz et al. | |
| 2010/0027687 A1 * | 2/2010 | De Natale et al. | 375/259 |
| 2010/0106154 A1 | 4/2010 | Harlev et al. | |
| 2011/0022245 A1 * | 1/2011 | Goodrum et al. | 700/297 |
| 2012/0262956 A1 * | 10/2012 | DeHaven | 363/21.09 |

* cited by examiner

*Primary Examiner* — Vincent Tran
(74) *Attorney, Agent, or Firm* — Larson Newman, LLP (57) ABSTRACT

A method of power flow mapping in a datacenter includes encoding, by a power supply unit of the datacenter, identification information that uniquely identifies the power supply unit, and modulating the encoded identification information onto a power cable, wherein the power supply unit receives operating power via the power cable. Modulating the encoded information onto the power cable further includes changing a voltage internal to the power supply unit to create a current change in the power cable.

16 Claims, 5 Drawing Sheets

SYSTEM AND METHOD FOR POWER FLOW MAPPING IN A DATACENTER

FIELD OF THE DISCLOSURE

This disclosure relates generally to information handling systems, and relates more particularly to power flow mapping in a datacenter.

BACKGROUND

As the value and use of information continues to increase, individuals and businesses seek additional ways to process and store information. One option is an information handling system. An information handling system generally processes, compiles, stores, or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, data storage systems, and networking systems. An information handling system can include virtual machines that run operating systems and applications on a common host system.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are illustrated and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion focuses on specific implementations and embodiments of the teachings. This focus is provided to assist in describing the teachings, and should not be interpreted as a limitation on the scope or applicability of the teachings. However, other teachings can be used in this application. The teachings can also be used in other applications, and with several different types of architectures, such as distributed computing architectures, client/server architectures, or middleware server architectures and associated resources.

Figure 1:
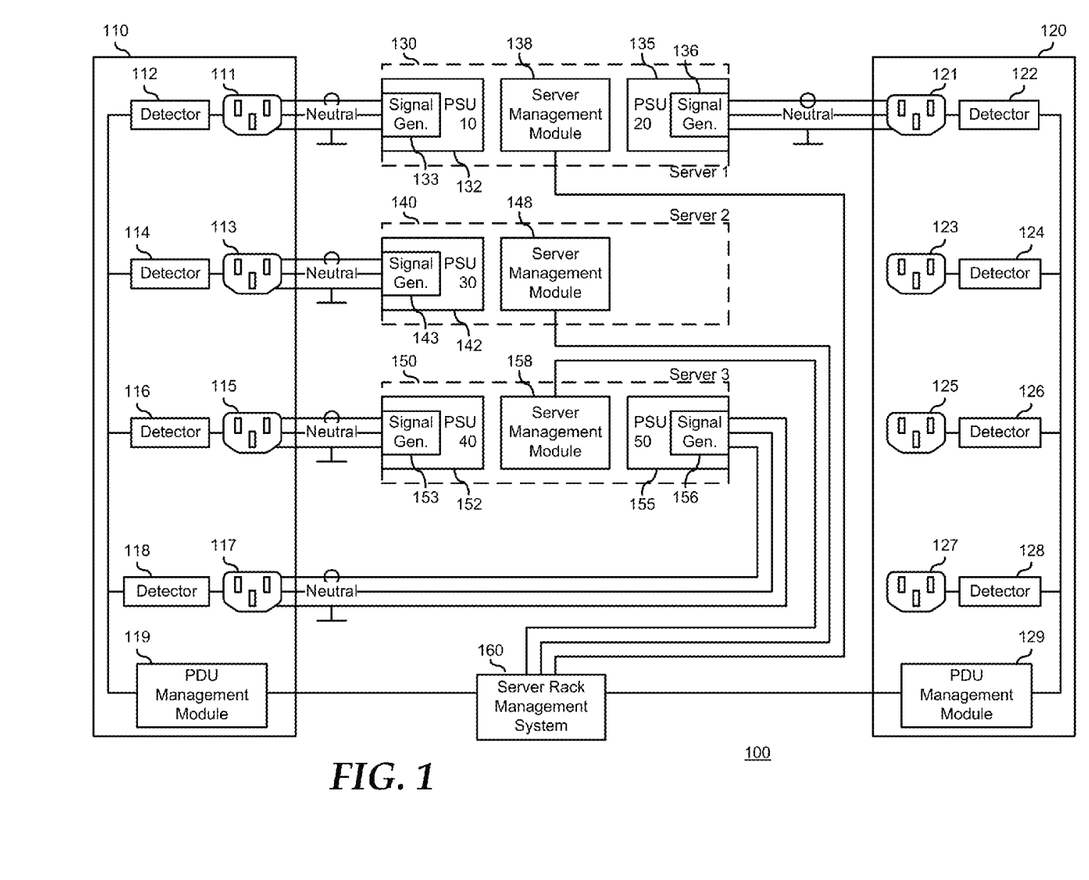
FIG. 1 is a block diagram of a server rack according to an embodiment of the present disclosure.

FIG. 1 illustrates a rack 100 for one or more information handling systems. For purpose of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic, and operates to execute code. Additional components of the information handling system may include one or more storage devices that can store code, one or more communications ports for communicating with external devices as well as various input and output (I/O) devices, such as a keyboard, a mouse, and a video display. The information handling system may also include one or more buses operable to transmit communications between the various hardware components.

Server rack 100 includes power distribution units (PDUs) 110 and 120, servers 130, 140, and 150, and a server rack management system 160. PDU 110 includes power receptacles 111, 113, 115, and 117 and associated power detectors 112, 114, 116, and 118 respectively, and a PDU management module 119. PDU 120 includes power receptacles 121, 123, 125, and 127 and associated power detectors 122, 124, 126, and 128 respectively, and a PDU management module 129. Server 130 includes power supply units (PSUs) 132 and 135 and a server management module 138. PSUs 132 and 135 each include a signal generator 133 and 136, respectively. Server 140 includes PSU 142 and a server management module 148. PSU 142 includes a signal generator 143. Server 150 includes PSUs 152 and 155 and a server management module 158. PSUs 152 and 155 each include a signal generator 153 and 156, respectively.

PDUs 110 and 120 operate to receive power from a datacenter power system (not illustrated) and to provide power to one or more elements of server rack 100. Thus server 130 is connected such that PSU 132 receives power from power receptacle 111 and PSU 135 receives power from power receptacle 121, server 140 is connected such that PSU 142 receives power from power receptacle 113, and server 150 is connected such that PSU 152 receives power from power receptacle 115 and PSU 155 receives power from power receptacle 117. PDUs 110 and 120 represent a wide variety of metered and monitored power distribution devices, such as PDUs, bus distribution units (BDUs), uninterruptable power supplies (UPSs), or other power distribution devices. PDUs 110 and 120 can include various power conditioning capabilities, such a voltage level shifting, rectification, voltage regulation and the like, as needed or desired. As illustrated, PSUs 132, 135, 142, 152, and 155 are connected to the respective power receptacles 111, 121, 113, 115, and 117 via 3-wire alternating current (AC) connections that include an AC phase wire, a neutral wire, and a ground wire; however this is not necessarily so, and the PSUs can be connected to the respective power receptacles in other AC or direct current (DC) configurations, as needed or desired.

PDUs 110 and 120 are metered PDUs in that each power receptacle 111, 113, 115, 117, 121, 123, 125, and 127 is associated with a respective power detector 112, 114, 116, 118, 122, 124, 126, and 128 that provides an indication of the power being supplied by the power receptacles. For example, power detectors 112, 114, 116, 118, 122, 124, 126, and 128 can determine the power supplied by the respective power receptacles as a measure of the current supplied by each power receptacle, or by other power measurement mechanisms as needed or desired. Power detectors 112, 114, 116, and 118 provide the indication of the power being supplied by the respective power receptacles to PDU management module 119, and power detectors 122, 124, 126, and 128 provide the indication of the power being supplied by the respective power receptacles to PDU management module 129. In a particular embodiment, power detectors 112, 114, 116, 118, 122, 124, 126, and 128 provide analog power indications such as current measurement signals to the respective PDU management modules 119 and 129, and the PDU management modules convert the analog power indications to digital values. In another embodiment, power detectors 112, 114, 116, 118, 122, 124, 126, and 128 convert the power indications to the digital values.

PDUs 110 and 120 are managed PDUs in that the power indications and other information are provided via PDU management modules 119 and 129 to server rack management system 160, and the server rack management system can monitor and control the operations of the PDUs via the PDU management modules. For example, PDU management module 119 can provide an indication to server rack management system 160 that power is being supplied on each of power receptacles 111, 113, 115, and 117, and PDU management module 129 can provide an indication that power is only being supplied on power receptacle 121. Here server rack management system 160 can determine that the power distribution within server rack 100 is not balanced, and can direct PDUs 110 and 120 to provide visible indications, such as a red indicator lamp on PDU 110 and a green indicator lamp on PDU 120, that the configuration of power connections needs to be rearranged. In response, a technician can look for the visible indications and can rearrange the power connections to better balance the power distribution in server rack 100.

In a particular embodiment, PDUs 110 and 120 are configured to receive information via power receptacles 111, 113, 115, 117, 121, 123, 125, and 127, where the information is encoded by modulating power usage of the power supply devices that are connected to the receptacles, as described more fully below. For example PSUs 132, 135, 142, 152, and 155 can control peak currents in a way that is recognized by PDUs 110 and 120 as including encoded information. Thus, as illustrated signal generator 133 can encode a signal that includes information on the power connection to power receptacle 111, signal generator 136 can encode a signal that includes information on the power connection to power receptacle 121, signal generator 143 can encode a signal that includes information on the power connection to power receptacle 113, signal generator 153 can encode a signal that includes information on the power connection to power receptacle 115, and signal generator 156 can encode a signal that includes information on the power connection to power receptacle 117.

The encoded information for each PSU 132, 135, 142, 152, and 155 can include a unique identification of the PSUs. The unique identification of each PSU 132, 135, 142, 152, and 155 is decoded by the receiving power detector 112, 114, 116, 118, or 122 to provide a one-line power map of server rack 100, as described more fully below. The information can be decoded by power detectors 112, 114, 116, 118, 122, 124, 126, and 128, or the power indications from each power detector can be decoded by the respective PDU management module 119 or 129. The unique identification for each PSU 132, 135, 142, 152, and 155 can include a service tag number for each PSU, a part/model number and serial number for each PSU, other field replaceable unit (FRU) information, or another unique identifier, as needed or desired.

In a particular embodiment, server management modules 138, 148, and 158 represent managed service processors associated with respective servers 130, 140, and 150. For example, a managed service process can include a baseboard management controller (BMC), an integrated Dell remote access controller (iDRAC), another managed service processor, or a combination thereof. Here, server management controllers 138, 148, and 158 determine the unique identifications for their associated PSUs 132, 135, 142, 152, and 155, and communicate the unique identification to server rack management system 160. In this way, not only can server rack management system 160 determine that the power distribution within server rack 100 is not balanced, but the server rack management system can also determine whether or not servers 130 and 150 are powered redundantly, that is with one PSU connected to each of PDUs 110 and 120.

For example, signal generator 153 modulates the power usage of PSU 152 to encode the unique identification of the PSU onto the connection to power receptacle 115. In a particular embodiment, power detector 116 decodes the encoded information from signal generator 153 and sends the unique identification of PSU 152 to PDU management module 119. In another embodiment, the encoded information is decoded by PDU management module 119. In either case, PDU management module 119 communicates the fact that PSU 152 is connected to power receptacle 115 to server rack management system 116. Similarly, signal generator 156 modulates the power usage of PSU 155 to encode the unique identification of the PSU onto the connection to power receptacle 117, and PDU management module 119 communicates the fact that PSU 155 is connected to receptacle 117 to server rack management system 160. In this way, server rack management system 160 determines that PSUs 152 and 155 are both connected to PDU 110.

In a particular embodiment, signal generators 133, 136, 143, 153, and 156 provide their respective unique identifications to PDUs 110 and 120 when the signal generators are connected to power receptacles 111, 113, 115, 117, and 121. For example, signal generator 133 can encode a unique identifier for PSU 132 when the PSU is connected to power receptacle 111. In a first aspect, signal generators 133, 136, 143, 153, and 156 operate to provide their respective unique identifications to PDUs 110 and 120 without regard to the operating status of the respective servers 130, 140, and 150. For example, signal generator 136 can encode a unique identifier for PSU 135 while server 130 is powered off, or in a standby state. Here, an operating state of PSU 135 can be changed to cause a result in a standby load of the PSU, such as by increasing and decreasing an operating voltage of the PSU, by increasing and decreasing a fan speed of the PSU, or by changing another operating condition of the PSU that otherwise results in modulated power levels being detected by detector 114, as needed or desired. In a second aspect, signal generators 133, 136, 143, 153, and 156 operate to provide their respective unique identifications to PDUs 110 and 120 based upon an operating status of the respective servers 130, 140, and 150. For example, signal generator 143 can encode a unique identifier for PSU 142 by changing a power load of server 140, such as by increasing and decreasing a load on a processor of the server, by increasing and decreasing a fan speed of the server, or by changing another operating condition of the server that otherwise results in modulated power levels being detected by detector 114, as needed or desired.

In another embodiment, signal generators 133, 136, 143, 153, and 156 provide their respective unique identifications to PDUs 110 and 120 on a periodic basis, such as once an hour, once a day, or another period, as needed or desired. In yet another embodiment, signal generators 133, 136, 143, 153, and 156 provide their respective unique identifications to PDUs 110 and 120 on an as needed basis. For example, server rack management system 160 can direct server management module 148 to initiate an identification session where signal generator 143 encodes a unique identifier for PSU 142 to power receptacle 113. In another embodiment, when PDU 110 or 120 detects a newly connected device, such as PSU 132, 135, 142, 152, or 155, and the PDU provides an indication to server rack management system 160 that the connectivity of server rack 100 has changed. Server rack management system 160 then directs signal generators 133, 136, 143, 153, and 156 and any other connected devices in the server rack to provide their respective unique identifications to the PDUs in response to receiving the indication.

In a particular implementation, it may be needed or desired for server 150 to be connected to power such that PSUs 152 and 155 are each connected to a different PDU 110 and 120. Here, based upon the example above, server rack management system 160 determines that both PSUs 152 and 155 are connected to PDU 110, and so the server rack management system directs PDU 110 to provide a visible indication, such as a blinking red indicator lamp associated with one of power receptacles 115 and 117, indicating that the power connection to the power receptacles are to PSUs 152 and 155, that is that the power connections to server 150 are not redundant. For example, a technician can look for the visible indication and can unplug PSU 155 from that power receptacle. Further, server rack management system 160 can direct PDU 120 to provide a visible indication, such as a blinking green indicator lamp associated with one of the unused power receptacles 123, 125, and 127, indicating that the unplugged PSU 155 is to be plugged into that power receptacle in order to provide redundant power connections to server 150. For example, the technician can look for the visible indication and can plug PSU 155 into that power receptacle.

In a particular embodiment, PDUs 110 and 120 are each associated with a different phase of a three-phase electrical service. For example, server rack 100 may be associated with a datacenter that includes one or more additional server racks, each with one or more PDUs similar to PDUs 110 and 120, and that are associated with one of the phases of the three-phase electrical service. The one or more additional server racks can also include one or more additional servers similar to servers 130, 140, and 150. Here, server rack management system 160 can represent a datacenter management system that can determine the loading of all of the servers in the datacenter, and can further determine a one-line power map of the datacenter. Further, server rack management system 160 can determine from the one-line power map of the datacenter, whether or not the three phases of the three-phase electrical service are balanced, and can provide visible indications that alert a technician to reconfigure the power connections within server rack 100 and the one or more additional server racks, in order to better balance the power loads on each phase of the three-phase electrical service.

In a particular embodiment, PDUs 110 and 120 operate to receive detection parameters from server rack management system 160. For example, the detection parameters can include an expected voltage or current transition step size that is associated with a bit of information, a transition frequency or data window period, an expected set-up or initialization sequence, another detection parameter, or a combination thereof. In this way, PDUs 110 and 120 can be configured to detect encoded information from a variety of different PSUs 132, 135, 142, 152, or 155 that may each be configured to provide the encoded information in a different way. In particular, server rack management system 160 can poll server management modules 138, 148, and 158 to determine the configurations of respective PSUs 132, 135, 142, 152, and 155, and can provide the detection parameters associated with each PSU to PDUs 110 and 120. In another embodiment, server rack management system 160 polls server management modules 138, 148, and 158 to determine the configurations of respective PSUs 132, 135, 142, 152, and 155, the server rack management system receives the detected power information from power detectors 112, 114, 116, 118, 121, 123, 124, and 128, and the server rack management system decodes the encoded information from the detected power information. In this way PDUs 110 and 120 operate without decoding the encoded information, and server rack management system 160 generates the one-line power map for rack server 100.

Figure 2:
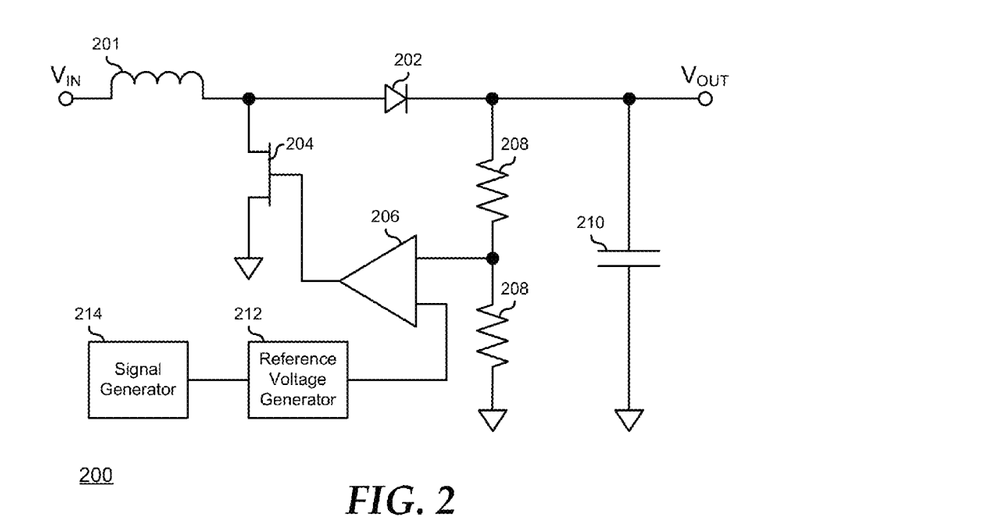
FIG. 2 is a block diagram of a power factor correction stage of a power supply according to an embodiment of the present disclosure.

FIG. 2 illustrates a power factor correction (PFC) stage 200 of a power supply similar to PSUs 132, 135, 142, 152, and 155. PFC stage 200 includes an inductor 201, a rectifying diode 202, a power transistor 204, a voltage comparator 206, a voltage divider 208, a bulk capacitor 210, a reference voltage generator 212, and a signal generator 214. PFC stage 200 operates as a half-wave rectifying power supply, where an input voltage is provided to diode 202 to provide an output voltage. The output voltage is measured via voltage divider 208 to provide a first input to voltage comparator 206. A second input is provided to voltage comparator 206 from reference voltage generator 212. An output of voltage comparator 206 drives an input of transistor 204. Here, transistor 204 acts as a variable resistor where the on time is adjusted by comparator 206 as the input voltage changes. A resulting AC waveform is sensed and the on time of transistor 204 is adjusted to make the input appear more resistive. Bulk capacitor 210 operates to sink or source current to a load connected to the output voltage.

Signal generator 214 operates to encode information to a PDU similar to PDUs 110 or 120 by modulating power usage of power supply 100. In particular, signal generator 214 operates to direct reference voltage generator 212 to change the voltage reference signal provided to the input of voltage comparator 206, in order to modulate the peak current to bulk capacitor 210. For example, raising the level of the output of reference voltage generator 212 will result in increasing the on time of transistor 204 so that more energy is stored in inductor 201, such that in the off time of the transistor, the stored energy is dumped from inductor 201, thereby raising the voltage on capacitor 210. The increased on time of transistor 204 results in an increased current seen at the input to PFC stage 200. The increased current is used to encode information. The increased current into bulk capacitor 210 can be detected by the PDU as described above. Similarly, lowering the level of the output of the reference voltage generator 212 causes the on time of transistor 204 to be reduced, thereby lowering the voltage applied to bulk capacitor 210 and resulting in a reduced current being drawn by PFC stage 200. The lessened current drawn by PFC stage 200 can also be detected by the PDU as described above.

Figure 3:
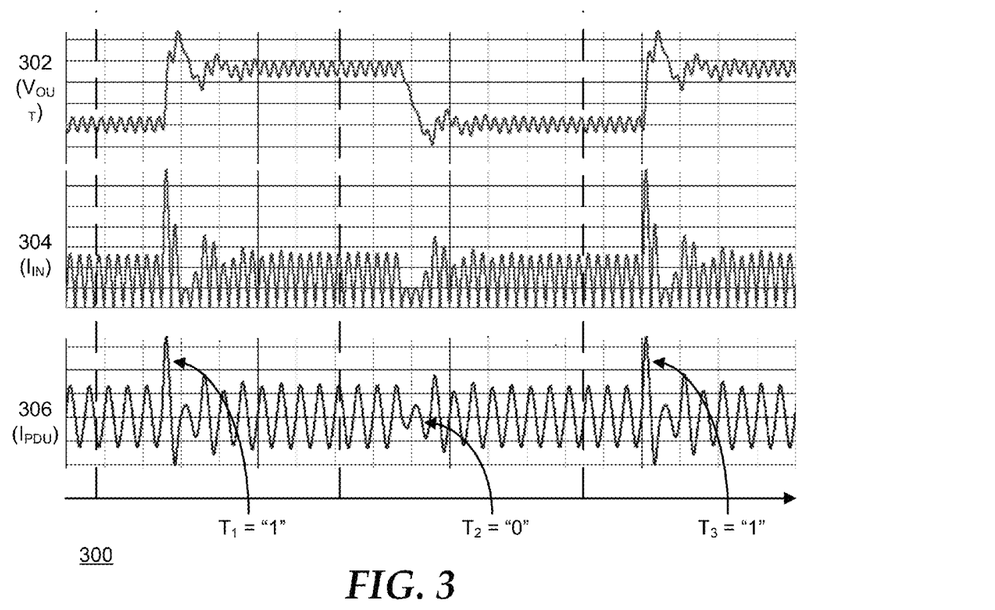
FIG. 3 is a diagram of signal traces of a power supply similar to the power supply of FIG. 2.

FIG. 3 illustrates information encoded by modulating power usage of a PFC stage similar to PFC stage 200, and that is connected to a power receptacle of a metered and monitored PDU similar to PDUs 110 and 120. A trace 302 illustrates an output voltage of the PFC stage, a trace 304 illustrates an input current to the PFC stage, and a trace 306 illustrates an output current of a PDU that is connected to the PFC stage. The output voltage of the PFC stage is changed in a manner that encodes information on the input current of the PFC stage, and that is detected by the PDU as a change in the output current of the PDU. As such, output voltage trace 302 shows that the output voltage starts at a first voltage level and in a first time window $T_1$ the voltage is changed to a higher voltage level. In response to the changed voltage level at $T_1$, input current trace 304 shows that the input current increases in a current spike, and output current trace 306 shows that the output current of the PDU also increases in a current spike. In a second time window $T_2$, output voltage trace 302 shows that the output voltage drops back to the first voltage level. In response to the changed voltage level at $T_2$, input current trace 304 shows that the input current decreases and output current trace 306 shows that the output current of the PDU also decreases. Finally, in a third time window $T_3$, output voltage trace 302 shows that the output voltage again rises to the higher voltage level. In response to the changed voltage level at $T_3$, input current trace 304 and output current trace 306 each show a current spike.

In a particular embodiment, the PDU detects a current spike as logic "1", and at time window $T_1$ a first bit of information is sent from the PFC stage to the PDU. Further, the PDU detects a current decrease as logic "0", and at time window $T_2$ a second bit of information is sent to the PDU. Finally, a third bit of information, logic "1," is received by the PDU at time window $T_3$. The skilled artisan will understand that various encoding schemes can be utilized to encode information, as needed or desired. For example, in order to eliminate the need to control the output voltage of a PFC stage to multiple levels, no change in the voltage level in a particular time window can be decoded as "same as the last bit." For example, the bit sequence 0b01110001 can be encoded by a voltage trace that starts at a low level in a first time window, then changes to a high level in a second time window and remains at the high level through a third and a fourth time windows, then changes to a low level in a fifth time window and remains at the low level through the sixth and seventh time windows, and finally changes to a high level in the eighth time window. In another example, the information can be encoded in an 8-bit/10-bit encoding scheme, where eight bits of information are encoded in ten bits, in order to achieve a balance of the output voltage. Here, the difference between the count of 1s and 0s (i.e., the difference between the number of high voltage levels and low voltage levels) in a string of at least 20 bits is no more than 2, and there are not more than five 1s or 0s in a row (i.e., the voltage levels will not remain either high or low for more than five consecutive time windows).

In a particular embodiment, within a particular time window, the PFC stage changes an output voltage from a first voltage level to a second voltage level then changes the voltage level back to the first voltage level to encode a bit value, and within another time window, the PFC stage keeps the output voltage level unchanged to encode an opposite bit value. The voltage level change in the PFC stage can translate into a detected current spike followed by a current decrease in the PDU within a first time window, and the PDU can thereby detect logic "1." Further, the unchanged voltage level in the PFC stage can translate into a constant current in the PDU for another time window, and the PDU can thereby detect logic "0."

Figure 4:
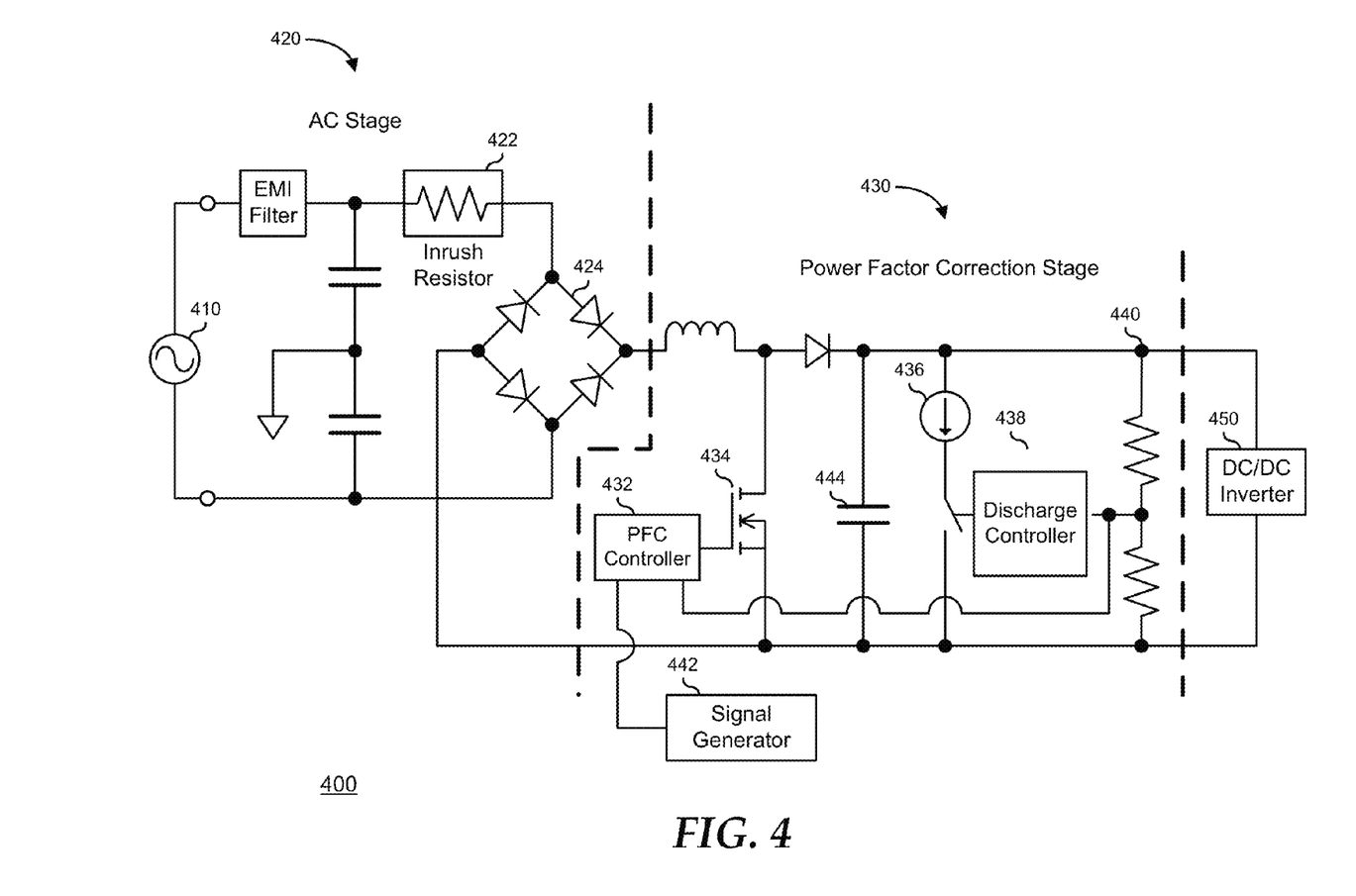
FIG. 4 is a block diagram of another power supply according to an embodiment of the present disclosure.

FIG. 4 illustrates a PFC stage 400 similar to PFC stage 200, including an AC stage 420, a PFC stage 430, and a DC-to-DC converter stage 450. AC stage 420 includes an inrush resistor 422, and a rectifier 424. PFC stage 230 includes a PFC controller 432, a power MOSFET 434, a current sink 436, a discharge controller 438, a voltage divider 440, a signal generator 442, and a bulk capacitor 444. Power supply 400 operates as a full-wave rectifying power supply, where an input voltage is provided via a PDU 410, and is then boosted by PFC stage 430. The voltage provided as an output to DC-to-DC converter 450 is a regulated voltage, the level of which is controlled via PFC controller 432 and power MOSFET 434. The output voltage is measured via voltage divider 440 to provide an input to PFC controller 432, and to discharge controller 438. An output of PFC controller 432 drives an input of MOSFET 434. Here, MOSFET 434 acts similarly to transistor 204 as described above, where the on time is adjusted to track the input voltage waveform from rectifier 424. Bulk capacitor 444 operates as an input energy storage element for DC-DC converter 450.

Signal generator 442 is similar to signal generator 214 and operates to encode information to a PDU similar to PDUs 110 or 120 by modulating power usage of power supply 400. In particular, signal generator 442 directs the reference of PFC controller 432 which modulates MOSFET 434. This results in a change to the voltage across capacitor 444 and also the input current of the PFC stage 400. It is this change in input current that is used to encode the information. In a particular embodiment, PFC stage 400 operates such that within a particular time window, the PFC stage changes the input voltage from a first voltage level to a second voltage level then changes the voltage level back to the first voltage level to encode a bit value, and within another time window, the PFC stage keeps the input voltage level unchanged to encode an opposite bit value. Here, in order to speed up the recovery time for the voltage level to decrease from the higher voltage level to the lower voltage level, discharge controller 438 operates to close a switch associated with current sink 436, thereby discharging bulk capacitor 444 faster than would be the case if only the load on DC-to-DC converter 450 is used to discharge the bulk capacitor. In particular, if a server system that is powered by PFC stage 400 is powered off, then the time to discharge bulk capacitor 444 from the higher voltage level to the lower voltage level can be limited to a time associated with a leakage current for the DC-to-DC converter. Thus PFC stage 400 is operable to encode information to the PDU, even when an associated server is powered off. An example current sink 436 can include a resistor network, a PFC stage fan, a PFC stage fan controller that turns a fan at a higher speed when a faster discharge of bulk capacitor 444 is desired, or another current sink, as needed or desired.

Figure 5:
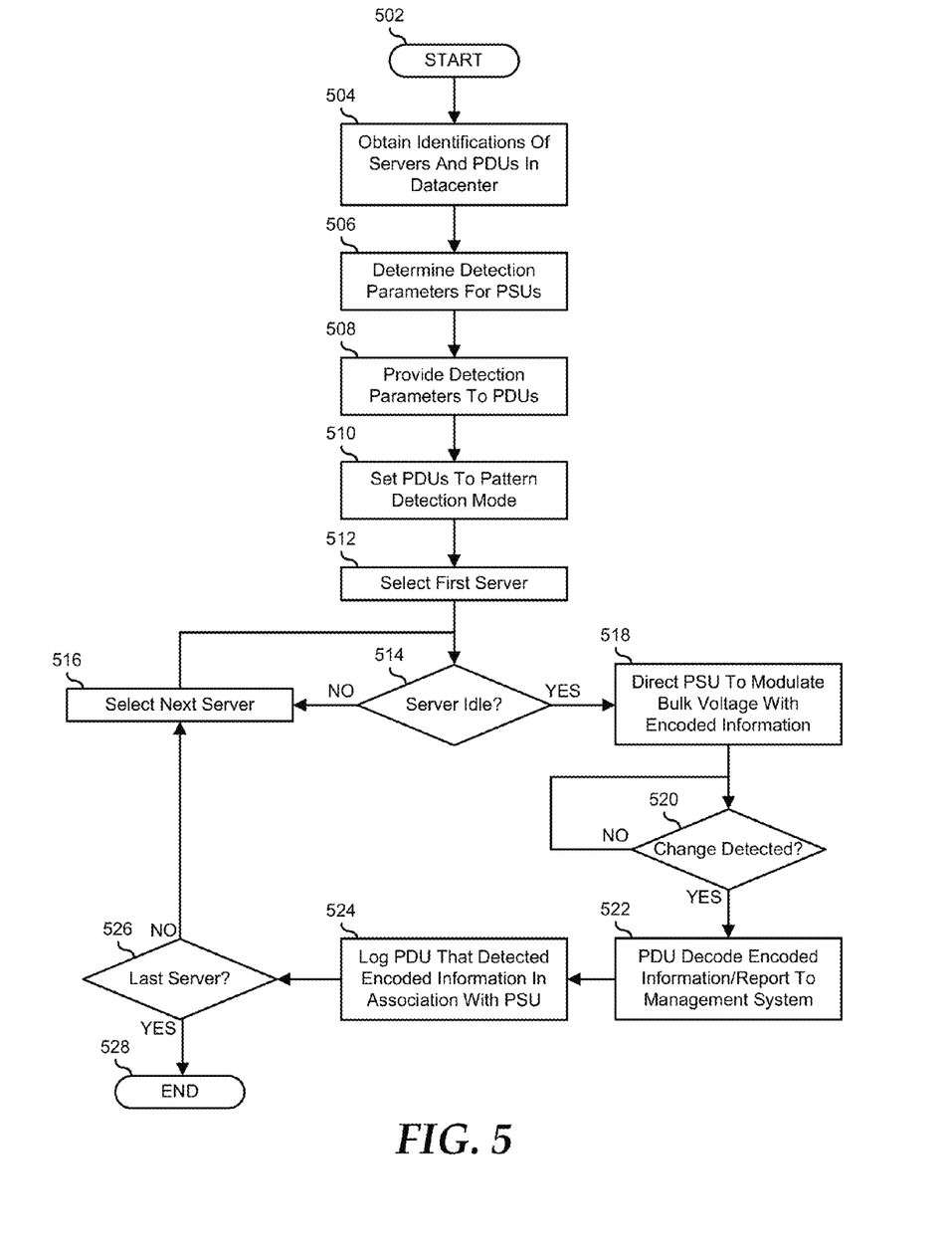
FIG. 5 is a flow diagram of a method of power flow mapping in a datacenter according to an embodiment of the present disclosure.

FIG. 5 illustrates a method of power flow mapping in a datacenter, starting at block 502. Identification information for each server and PDU in a datacenter is obtained in block 504. For example, a server rack management system can poll PDU management modules and server management modules to obtain the identification information that can include a service tag number, a part/model number and serial number, other field replaceable unit (FRU) information, IP addresses, or unique identifier, as needed or desired. Detection parameters are determined for each PSU in each server in block 506. For example, the server rack management system can poll the PSUs to obtain detection parameters such as expected voltage or current transition step sizes, transition frequencies or data window periods, expected set-up or initialization sequences, or other detection parameters. The detection parameters are provided to the PDUs in block 508. Here, the server rack management system can provide the detection parameters to the PDU management modules. In another embodiment, the detection parameters can be maintained by the server rack management system, and the subsequent decoding steps that are described with respect to the PDUs can be performed in the server rack management system.

The PDUs are set to a pattern detection mode in block 510. For example, the server rack management system can send an indication to the PDUs to enter a pattern detection mode. The mode can be set on a periodic basis, or can be set when the server rack management system detects a newly added server or PSU. A first server is selected in block 512. It will be understood that, where a particular server includes more than one PSU, that a first PSU can be selected as a sub-step to the present method. A decision is made as to whether or not the first server is in an idle state, such as a power-off state or a standby state in decision block 514. If not, the "NO" branch of decision block 514 is taken, a next server is selected in block 516, and the method returns to decision block 514 where a decision is made as to whether or not the next server is in an idle state. If the first server is in an idle state, the "YES" branch of decision block 514 is taken, and the PSU of the selected server is directed to modulate the bulk voltage to encode the identification information of the PSU to the connected PDU in block 518. For example, the server rack management system can direct the server management module of the selected server to direct a PSU associated with the server to encode the identification information of the PSU to the connected PDU.

A decision is made as to whether or not the change is detected by one of the PDUs in decision block 520. If not, the "NO" branch of decision block 520 is taken and the method continues at decision block 520 until the change is detected. In another embodiment, a timing function can be introduced, such that, if none of the PDUs detect the voltage or current changes associated with the selected server, the method can proceed to block 516 where a next server is selected. If the change is detected by one of the PDUs, the "YES" branch of decision block 520 is taken and the PDU that detected the change decodes the encoded information and reports the information to the server rack management system in block 522. In another embodiment, all of the PDUs provide the detected power information from each power receptacle to the server rack management system, and the server rack management system decodes the information. The PDU that detected the encoded information is logged as being associated with the sending PSU in block 524. For example, the server rack management system can create a table that associates each PSU with the PDU that it is connected to, and can create a one-line power map based upon the table. A decision is made as to whether or not the selected server is the last server in decision block 526. If not, the "NO" branch of decision block 526 is taken and the method proceeds to block 516 where a next server is selected. If the selected server is the last server, the "YES" branch of decision block 526 is taken and the method ends as block 528.

Figure 6:
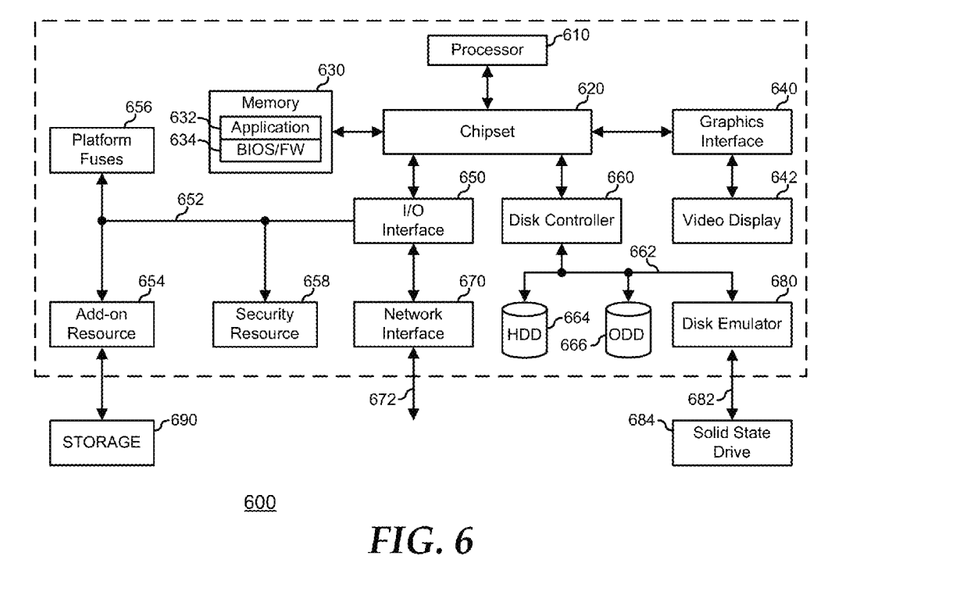
FIG. 6 is a functional block diagram illustrating an exemplary embodiment of an information handling system.

FIG. 6 illustrates an information handling system 600, including a processor 610, a chipset 620, a memory 630, a graphics interface 640, an input/output (I/O) interface 650, a disk controller 660, a network interface 670, and a disk emulator 680. In a particular embodiment, information handling system 600 is used to carry out one or more of the methods described herein. In another embodiment, one or more of the systems described herein are implemented in the form of information handling system 600.

Chipset 620 is connected to and supports processor 610, allowing the processor to execute machine-executable code. In a particular embodiment, information handling system 600 includes one or more additional processors, and chipset 620 supports the multiple processors, allowing for simultaneous processing by each of the processors and permitting the exchange of information among the processors and the other elements of the information handling system. Chipset 620 can be connected to processor 610 via a unique channel, or via a bus that shares information among the processor, the chipset, and other elements of information handling system 600.

Memory 630 is connected to chipset 620. Memory 630 and chipset 620 can be connected via a unique channel, or via a bus that shares information among the chipset, the memory, and other elements of information handling system 600. In another embodiment (not illustrated), processor 610 is connected to memory 630 via a unique channel. In another embodiment (not illustrated), information handling system 600 includes separate memory dedicated to each of the one or more additional processors. A non-limiting example of memory 630 includes static random access memory (SRAM), dynamic random access memory (DRAM), non-volatile random access memory (NVRAM), read only memory (ROM), flash memory, another type of memory, or any combination thereof.

Graphics interface 640 is connected to chipset 620. Graphics interface 640 and chipset 620 can be connected via a unique channel, or via a bus that shares information among the chipset, the graphics interface, and other elements of information handling system 600. Graphics interface 640 is connected to a video display 642. Other graphics interfaces (not illustrated) can also be used in addition to graphics interface 640 as needed or desired. Video display 642 includes one or more types of video displays, such as a flat panel display, another type of display device, or any combination thereof.

I/O interface 650 is connected to chipset 620. I/O interface 650 and chipset 620 can be connected via a unique channel, or via a bus that shares information among the chipset, the I/O interface, and other elements of information handling system 600. Other I/O interfaces (not illustrated) can also be used in addition to I/O interface 650 as needed or desired. I/O interface 650 is connected via an I/O interface 652 to one or more add-on resources 654. Add-on resource 654 is connected to a storage system 690, and can also include another data storage system, a graphics interface, a network interface card (NIC), a sound/video processing card, another suitable add-on resource or any combination thereof. I/O interface 650 is also connected via I/O interface 652 to one or more platform fuses 656 and to a security resource 658. Platform fuses 656 function to set or modify the functionality of information handling system 600 in hardware. Security resource 658 provides a secure cryptographic functionality and includes secure storage of cryptographic keys. A non-limiting example of security resource 658 includes a Unified Security Hub (USH), a Trusted Platform Module (TPM), a General Purpose Encryption (GPE) engine, another security resource, or a combination thereof.

Disk controller 660 is connected to chipset 620. Disk controller 660 and chipset 620 can be connected via a unique channel, or via a bus that shares information among the chipset, the disk controller, and other elements of information handling system 600. Other disk controllers (not illustrated) can also be used in addition to disk controller 660 as needed or desired. Disk controller 660 includes a disk interface 662.

Disk controller 660 is connected to one or more disk drives via disk interface 662. Such disk drives include a hard disk drive (HDD) 664, and an optical disk drive (ODD) 666, and can include one or more disk drive as needed or desired. ODD 666 can include a Read/Write Compact Disk (R/W-CD), a Read/Write Digital Video Disk (R/W-DVD), a Read/Write mini Digital Video Disk (R/W mini-DVD, another type of optical disk drive, or any combination thereof. Additionally, disk controller 660 is connected to disk emulator 680. Disk emulator 680 permits a solid-state drive 684 to be coupled to information handling system 600 via an external interface 682. External interface 682 can include industry standard busses such as USB or IEEE 1394 (Firewire) or proprietary busses, or any combination thereof. Alternatively, solid-state drive 684 can be disposed within information handling system 600.

Network interface device 670 is connected to I/O interface 650. Network interface 670 and I/O interface 650 can be coupled via a unique channel, or via a bus that shares information among the I/O interface, the network interface, and other elements of information handling system 600. Other network interfaces (not illustrated) can also be used in addition to network interface 670 as needed or desired. Network interface 670 can be a network interface card (NIC) disposed within information handling system 600, on a main circuit board such as a baseboard, a motherboard, or any combination thereof, integrated onto another component such as chipset 620, in another suitable location, or any combination thereof. Network interface 670 includes a network channel 672 that provide interfaces between information handling system 600 and other devices (not illustrated) that are external to information handling system 600. Network interface 670 can also include additional network channels (not illustrated).

Information handling system 600 includes one or more application programs 632, and Basic Input/Output System and Firmware (BIOS/FW) code 634. BIOS/FW code 634 functions to initialize information handling system 600 on power up, to launch an operating system, and to manage input and output interactions between the operating system and the other elements of information handling system 600. In a particular embodiment, application programs 632 and BIOS/FW code 634 reside in memory 630, and include machine-executable code that is executed by processor 610 to perform various functions of information handling system 600. In another embodiment (not illustrated), application programs and BIOS/FW code reside in another storage medium of information handling system 600. For example, application programs and BIOS/FW code can reside in HDD 664, in a ROM (not illustrated) associated with information handling system 600, in an option-ROM (not illustrated) associated with various devices of information handling system 600, in storage system 690, in a storage system (not illustrated) associated with network channel 672, in another storage medium of information handling system 600, or a combination thereof. Application programs 632 and BIOS/FW code 634 can each be implemented as single programs, or as separate programs carrying out the various features as described herein.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality. The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A method of power flow mapping in a datacenter, the method comprising:
encoding, by a power supply unit of the datacenter, identification information that uniquely identifies the power supply unit; and modulating the encoded identification information onto a power cable, wherein the power supply unit receives operating power via the power cable;

wherein modulating the encoded information onto the power cable further comprises:

changing a voltage internal to the power supply unit to create a current change in the power cable, and wherein in changing the voltage the method further comprises:

changing the voltage from a first voltage level to a second voltage level to encode a first logical state, wherein the first voltage level is a lower voltage than the second voltage level, and the first logic state corresponds to a peak current to a capacitor of the power supply device; and changing the voltage from the second voltage level to the first voltage level to encode a second logical state, wherein the second logic state corresponds to a current outflow from the capacitor.

2. The method of claim 1, wherein an information handling system that receives operating power from the power supply unit is powered off during the encoding and the modulating.

3. The method of claim 1, wherein:

changing the voltage internal to the power supply unit to create the current change in the power cable encodes a first logical state; and modulating the encoded information onto the power cable further comprises maintaining the voltage at a same level encodes a second logical state.

4. The method of claim 1, wherein:

a first logical state is encoded when the voltage is changed from a first voltage level to a second voltage level and is then changed back to the first voltage level during a predetermined time window; and a second logical state is encoded when the voltage remains unchanged during the predetermined time window.

5. The method of claim 4, wherein, in changing the voltage back to the first voltage level, the method further comprises:

operating a current sink to draw the voltage back t the first voltage level within the predetermined time window.

6. The method of claim 1, wherein the identification information is received by the power supply unit from a management system.

7. The method of claim 1, wherein the identification information is included in the power supply unit.

8. The method of claim 1, further comprising:

installing the power supply device in the datacenter;

wherein the encoding and the modulating is in response to installing the power supply device in the datacenter.

9. A power supply unit comprising:

a voltage rail; and a signal generator operable to:

encode identification information that uniquely identifies the power supply unit; and modulate the encoded identification information onto a power cable, wherein the power supply unit receives operating power via the power cable, wherein in modulating the encoded identification the signal generator is further operable to change a voltage internal to the power supply unit to create a current change in the power cable, and wherein in changing the voltage the signal generator is further operable to:

change the voltage from a first voltage level to a second voltage level to encode a first logical state, wherein the first voltage level is a lower voltage than the second voltage level, and the first logic state corresponds to a peak current to a capacitor of the power supply device; and change the voltage from the second voltage level to the first voltage level to encode a second logical state, wherein the second logic state corresponds to a current outflow from the capacitor.

10. The power supply unit of claim 9, wherein an information handling system that receives operating power from the power supply unit is powered off during the encoding and the modulating.

11. The power supply unit of claim 9, wherein:

changing the voltage internal to the power supply unit to create the current change in the power cable encodes a first logical state; and modulating the encoded information onto the power cable further comprises maintaining the voltage at a same level encodes a second logical state.

12. The power supply unit of claim 9, wherein:

a first logical state is encoded when the voltage is changed from a first voltage level to a second voltage level and is then changed back to the first voltage level during a predetermined time window;

a second logical state is encoded when the voltage remains unchanged during the predetermined time window;

in changing the voltage back to the first voltage level, the signal generator is further operable to switch a current sink to draw the voltage back t the first voltage level within the predetermined time window.

13. A non-transitory computer-readable medium including code for performing a method, the method comprising:

encoding, by a power supply unit of the datacenter, identification information, that uniquely identifies the power supply unit; and modulating the encoded identification information onto a power cable, wherein the power supply unit receives operating power via the power cable;

wherein modulating the encoded information onto the power cable further comprises:

changing a voltage internal to the power supply unit to create a current change in the power cable, and wherein in changing the voltage the method further comprises:

changing the voltage from a first voltage level to a second voltage level to encode a first logical state, wherein the first voltage level is a lower voltage than the second voltage level, and the first logic state corresponds to a peak current to a capacitor of the power supply device; and changing the voltage from the second voltage level to the first voltage level to encode a second logical state, wherein the second logic state corresponds to a current outflow from the capacitor.

14. The computer-readable medium of claim 13, wherein an information handling system that receives operating power from the power supply unit is powered off during the encoding and the modulating.

15. The computer-readable medium of claim 13, wherein:

changing the voltage internal to the power supply unit to create the current change in the power cable encodes a first logical state; and modulating the encoded information onto the power cable further comprises maintaining the voltage at a same level encodes a second logical state.

16. The computer-readable medium of claim 13, wherein:

a first logical state is encoded when the voltage is changed from a first voltage level to a second voltage level and is then changed back to the first voltage level during a predetermined time window;

a second logical state is encoded when the voltage remains unchanged during the predetermined time window;

in changing the voltage back to the first voltage level, the signal generator is further operable to switch a current sink to draw the voltage back t the first voltage level within the predetermined time window.

\* \* \* \* \*